US006980085B1

(12) United States Patent
Dando

(10) Patent No.: US 6,980,085 B1
(45) Date of Patent: *Dec. 27, 2005

(54) WIRELESS COMMUNICATION DEVICES AND METHODS OF FORMING AND OPERATING THE SAME

(75) Inventor: Ross S. Dando, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/570,365

(22) Filed: Apr. 13, 2000

Related U.S. Application Data

(63) Continuation of application No. 08/914,305, filed on Aug. 18, 1997, now abandoned.

(51) Int. Cl.[7] ................. H04Q 5/22; H01L 23/28; H01L 23/34
(52) U.S. Cl. ................ 340/10.4; 174/52.2; 257/723
(58) Field of Search ............. 340/10.4, 10.41, 340/10.42, 10.5, 10.51, 10.52, 10.6, 825.71, 340/825.72, 3.51, 568.1, 572.1, 10.1

(56) References Cited

U.S. PATENT DOCUMENTS

| 4,075,632 A | 2/1978 | Baldwin et al. |
| 4,631,546 A | 12/1986 | Dumas et al. |
| 4,709,201 A | 11/1987 | Schaefer et al. |
| 4,853,705 A | 8/1989 | Landt |
| 4,857,893 A | 8/1989 | Carroll |
| 4,926,182 A | 5/1990 | Ohta et al. |
| 5,030,940 A | 7/1991 | Siikarla |
| 5,061,943 A | 10/1991 | Rammos |
| 5,138,651 A | 8/1992 | Sudo |
| 5,151,946 A | 9/1992 | Martensson |
| 5,170,173 A | 12/1992 | Krenz et al. |
| 5,392,049 A | 2/1995 | Gunnarsson |
| 5,400,039 A | 3/1995 | Araki et al. |
| 5,410,749 A | 4/1995 | Siwiak et al. |
| 5,442,367 A | 8/1995 | Naito et al. |
| 5,448,110 A | 9/1995 | Tuttle et al. |
| 5,480,842 A * | 1/1996 | Clifton et al. ............. 438/464 |
| 5,497,168 A | 3/1996 | Thomas et al. |
| 5,528,222 A * | 6/1996 | Moskowitz et al. ....... 340/10.1 |
| 5,550,547 A * | 8/1996 | Chan et al. .................. 342/42 |
| 5,552,790 A | 9/1996 | Gunnarsson |
| 5,569,879 A | 10/1996 | Gloton et al. |
| 5,621,412 A | 4/1997 | Sharpe et al. |

(Continued)

OTHER PUBLICATIONS

U.S. Appl. No. 09/660,537, Freddie w. Smith, *Preliminary Amendment*; filed Sep. 13, 2000; *Parent Application as filed with Preliminary Amendment; Pending Claims*.

(Continued)

*Primary Examiner*—Brian Zimmerman
*Assistant Examiner*—Clara Yang
(74) *Attorney, Agent, or Firm*—Wells St. John, P.S.

(57) ABSTRACT

Wireless communication devices and methods of forming and operating the same are provided. The present invention provides a wireless communication device including a substrate having a support surface, wireless communication circuitry upon the support surface of the substrate, at least one antenna electrically coupled with the wireless communication circuitry, a conductive layer configured to interact with the antenna, and an insulative layer intermediate the conductive layer and the antenna. A method of forming a wireless communication device includes providing a substrate having a support surface, forming an antenna upon the support surface, conductively coupling wireless communication circuitry with the antenna, forming an insulative layer over at least a portion of the antenna, and providing a conductive layer over at least a portion of the insulative layer.

97 Claims, 5 Drawing Sheets

U.S. PATENT DOCUMENTS

| | | | |
|---|---|---|---|
| 5,642,103 A | | 6/1997 | Tokuda et al. |
| 5,649,295 A | | 7/1997 | Shober |
| 5,649,296 A | | 7/1997 | MacLellan et al. |
| 5,682,143 A | * | 10/1997 | Brady et al. ............. 340/572.7 |
| 5,708,419 A | | 1/1998 | Isaacson et al. |
| 5,793,305 A | | 8/1998 | Turner |
| 5,815,120 A | | 9/1998 | Lawrence et al. |
| 5,859,587 A | | 1/1999 | Alicot et al. |
| 5,939,984 A | | 8/1999 | Brady et al. |
| 5,970,393 A | * | 10/1999 | Khorrami et al. ........ 340/10.34 |
| 5,995,048 A | * | 11/1999 | Smithgall et al. .... 343/700 MS |
| 6,049,278 A | | 4/2000 | Guthrie et al. |
| 6,118,379 A | | 9/2000 | Kodukula et al. |
| 6,133,836 A | | 10/2000 | Smith |
| 6,339,385 B1 | * | 1/2002 | Tuttle .................... 340/825.71 |
| 6,359,588 B1 | | 3/2002 | Kuntzsch |

OTHER PUBLICATIONS

U.S. Appl. No. 08/926,595, Mark E. Tuttle; *Original Application* filed Aug. 20, 1997;*Amendent* filed Feb. 22, 2000; *Amendment* filed Sep. 19, 2000; *CPA* filed Apr. 13, 2000; *CPA* filed Nov. 15, 1999; *Amendment* filed Apr. 21, 19991 *Pending Claims*.

Kraus, John D., *ANTENNAS Second Edition*, McGraw-Hill, Inc., New York, 1988, pp. 460-477, 716-725.

\* cited by examiner

WIRELESS COMMUNICATION DEVICES AND METHODS OF FORMING AND OPERATING THE SAME

RELATED PATENT DATA

This patent resulted from a continuation application of and claims priority to prior application Ser. No. 08/914,305, filed on Aug. 18, 1997, entitled "Wireless Communication Devices and Methods Of Forming And Operating The Same," now abandoned, the disclosure of which is incorporated herein by reference.

TECHNICAL FIELD

The present invention relates to wireless communication devices and methods of forming and operating the same.

BACKGROUND OF THE INVENTION

Electronic identification systems typically comprise two devices which are configured to communicate with one another. Preferred configurations of the electronic identification systems are operable to provide such communications via a wireless medium.

One such configuration is described in U.S. patent application Ser. No. 08/705,043, filed Aug. 29, 1996, assigned to the assignee of the present application and incorporated herein by reference. This application discloses the use of a radio frequency (RF) communication system including communication devices. The communication devices include interrogator and a transponder such as a tag or card.

The communication system can be used in various identification and other applications. The interrogator is configured to output a polling signal which may comprise a radio frequency signal including a predefined code. The transponders of such a communication system are operable to transmit an identification signal responsive to receiving an appropriate command or polling signal. More specifically, the appropriate transponders are configured to recognize the predefined code. The transponders receiving the code subsequently output a particular identification signal which is associated with the transmitting transponder. Following transmission of the polling signal, the interrogator is configured to receive the identification signals enabling detection of the presence of corresponding transponders.

Such communication systems are useable in identification applications such as inventory or other object monitoring. For example, a remote identification device is attached to an object of interest. Responsive to receiving the appropriate polling signal, the identification device is equipped to output an identification signal. Generating the identification signal identifies the presence or location of the identification device and article or object attached thereto.

Such identification systems configured to communicate via radio frequency signals are susceptible to incident RF radiation. Such RF radiation can degrade the performance of the identification system. For example, application of transponders to objects comprising metal may result in decreased or no performance depending on the spacing of the transponder antenna to the nearest metal on the object.

Therefore, there exists a need to reduce the effects of incident RF radiation upon the operation of communication devices of an electronic identification system.

SUMMARY OF THE INVENTION

According to one embodiment of the invention, a wireless communication device is provided which includes a substrate, communication circuitry, antenna and a conductive layer configured to interact with the antenna. Some embodiments of the wireless communication devices include remote intelligent communication devices and radio frequency identification devices.

According to additional aspects of the present invention, methods of forming a wireless communication device and a radio frequency identification device are provided. The present invention also provides methods of operating a wireless communication device and a radio frequency identification device.

The conductive layer is configured to act as a ground plane in one embodiment of the invention. The ground plane shields some signals from the antenna while reflecting other signals toward the antenna. The ground plane also operates to reflect some of the signals transmitted by the device. The conductive layer is preferably coupled with a terminal of a power source within the communication device. Such coupling provides the conductive layer at a reference voltage potential.

The communication circuitry comprises transponder circuitry in accordance with other aspects of the present invention. The transponder circuitry is configured to output an identification signal responsive to receiving a polling signal from an interrogator. Certain disclosed embodiments provide a processor within the communication devices configured to process the received polling signal. The processor and communication circuitry may be implemented in an integrated circuit.

The wireless communication device is provided within a substantially solid, void-free housing in accordance with one aspect of the present invention. Such a housing comprises plural encapsulant layers and a substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

This description of the present invention discloses embodiments of various wireless communication devices. The wireless communication devices are fabricated in card configurations (which include tags or stamps) according to first and second aspects of the present invention. The embodiments are illustrative and other configurations of a wireless communication device according to the present invention are possible. Certain embodiments of the wireless communication device according to the invention comprise radio frequency identification devices (RFID) and remote intelligent communication devices (RIC).

Figure 1:
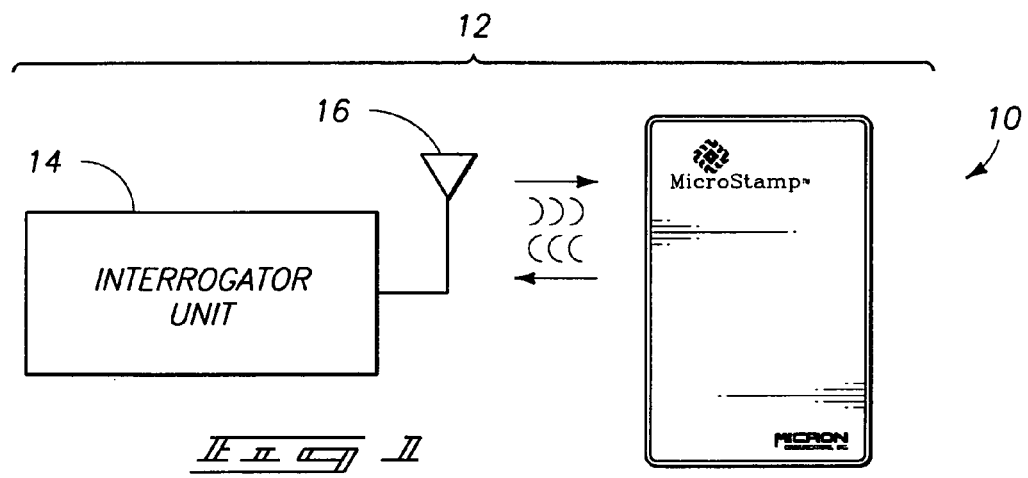
FIG. 1 is a block diagram of a wireless communication system including an interrogator and a wireless communication device embodying the invention.

Referring to FIG. 1, a remote intelligent communication device or wireless communication device 10 comprises part of a communication system 12. The remote intelligent communication device is capable of functions other than the identifying function of a radio frequency identification device. A preferred embodiment of the remote intelligent communication device includes a processor.

The communication system 12 shown in FIG. 1 further includes an interrogator unit 14. An exemplary interrogator 14 is described in detail in U.S. patent application Ser. No. 08/806,158, filed Feb. 25, 1997, assigned to the assignee of the present application and incorporated herein by reference. The wireless communication device 10 communicates via wireless electronic signals, such as radio frequency (RF) signals, with the interrogator unit 14. Radio frequency signals including microwave signals are utilized for communications in a preferred embodiment of communication system 12. The communication system 12 includes an antenna 16 coupled to the interrogator unit 14.

Figure 2:
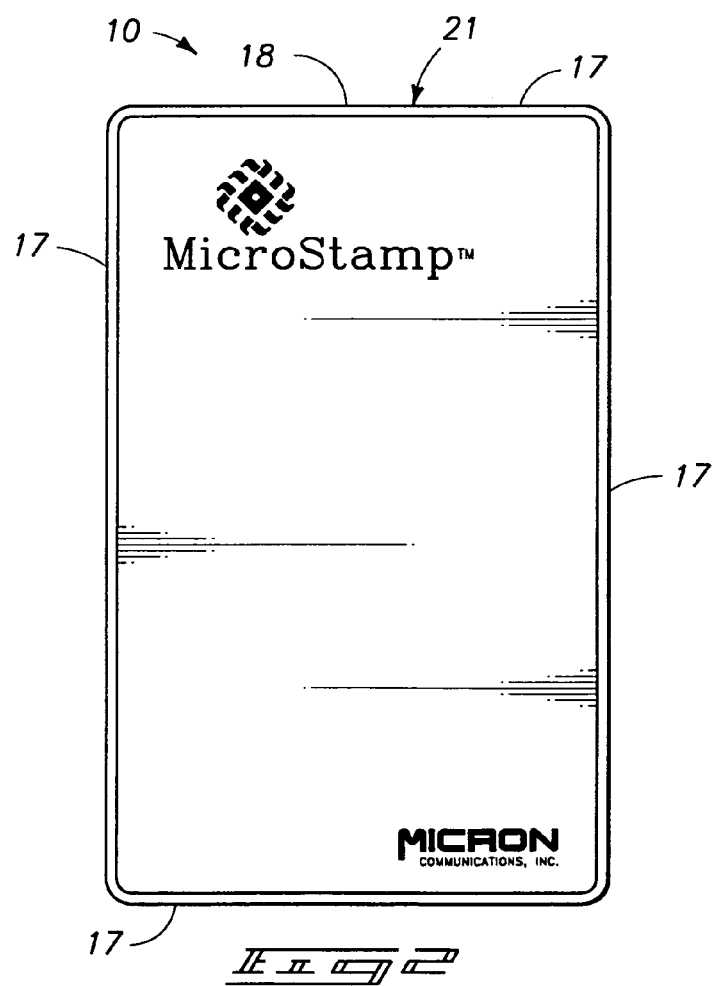
FIG. 2 is a front elevational view of the wireless communication device.

Referring to FIG. 2, the wireless communication device 10 includes an insulative substrate or layer of supportive material 18. The term "substrate" as used herein refers to any supporting or supportive structure, including but not limited to, a supportive single layer of material or multiple layer constructions. Example materials for the substrate 18 comprise polyester, polyethylene or polyimide film having a thickness of 4–6 mils (thousandths of an inch).

Substrate 18 provides a first or lower portion of a housing for the wireless communication device 10 and defines an outer periphery 21 of the device 10. Substrate 18 includes a plurality of peripheral edges 17.

Figure 3:
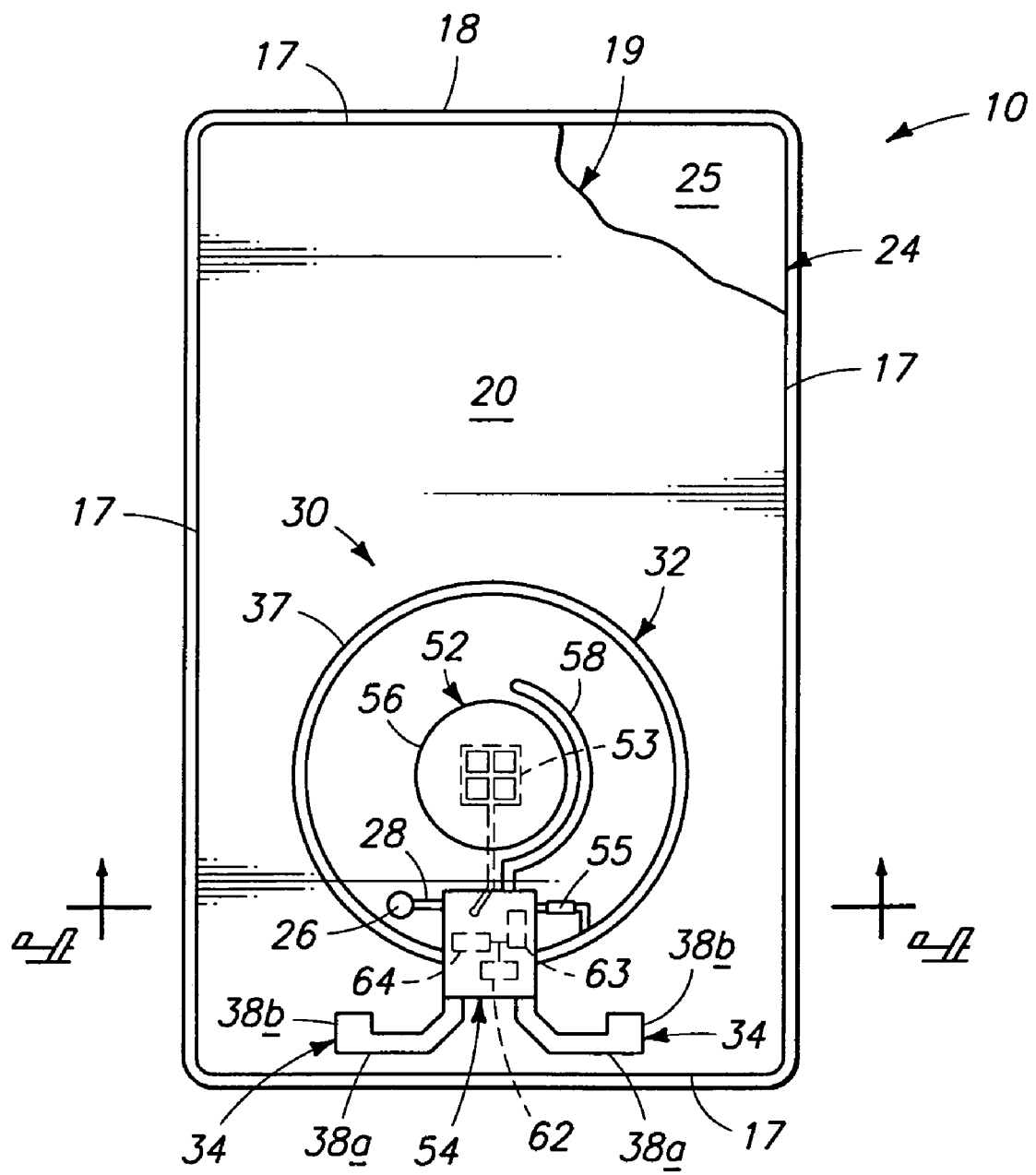
FIG. 3 is a front elevational view of the wireless communication device at an intermediate processing step.

Referring to FIG. 3, at least one ink layer 19 is applied to substrate 18 in preferred embodiments of the invention. Ink layer 19 enhances the appearance of the device 10 and conceals internal components and circuitry provided therein. A portion of ink layer 19 has been peeled away in FIG. 3 to reveal a portion of an upper surface 25 of substrate 18. In other embodiments, plural ink layers are provided upon upper surface 25.

A support surface 20 is provided to support components and circuitry formed in later processing steps upon substrate 18. In embodiments wherein at least one ink layer 19 is provided, support surface 20 comprises an upper surface thereof as shown in FIG. 3. Alternatively, upper surface 25 of substrate 18 operates as the support surface if ink is not applied to substrate 18.

A patterned conductive trace 30 is formed or applied over the substrate 18 and atop the support surface 20. Conductive trace 30 is formed upon ink layer 19, if present, or upon substrate 18 if no ink layer is provided. A preferred conductive trace 30 comprises printed thick film (PTF). The printed thick film comprises silver and polyester dissolved into a solvent. One manner of forming or applying the conductive trace 30 is to screen or stencil print the ink on the support surface 20 through conventional screen printing techniques. The printed thick film is preferably heat cured to flash off the solvent and UV cured to react UV materials present in the printed thick film.

The conductive trace 30 forms desired electrical connections with and between electronic components which will be described below. In one embodiment, substrate 18 forms a portion of a larger roll of polyester film material used to manufacture multiple devices 10. In such an embodiment, the printing of conductive trace 30 can take place simultaneously for a number of the to-be-formed wireless communication devices.

The illustrated conductive trace 30 includes an electrical connection 28, a first connection terminal 53 (shown in phantom in FIG. 3) and a second connection terminal 58. Conductive trace 30 additionally defines transmit and receive antennas 32, 34 in one embodiment of the invention. Antennas 32, 34 are suitable for respectively transmitting and receiving wireless signals or RF energy. Transmit antenna 32 constitutes a loop antenna having outer peripheral edges 37. Receive antenna 34 constitutes two elongated portions individually having horizontal peripheral edges 38a, which extend in opposing directions, and substantially parallel vertical peripheral edges 38b.

Other antenna constructions are possible. In particular, both transmit and receive operations are implemented with a single antenna in alternative embodiments of the present invention. Both antennas 32, 34 preferably extend or lie within the confines of peripheral edges 17 and outer periphery 21 and define a plane (shown in FIG. 4).

One embodiment of a wireless communication device 10 includes a power source 52, integrated circuit 54, and capacitor 55. Power source 52, capacitor 55, and integrated circuit 54 are provided and mounted on support surface 20 and supported by substrate 18. The depicted power source 52 is disposed within transmit antenna 32 of wireless communication device 10. Capacitor 55 is electrically coupled with loop antenna 32 and integrated circuit 54 in the illustrated embodiment.

Power source 52 provides operational power to the wireless communication device 10 and selected components therein, including integrated circuit 54. In the illustrated embodiment, power source 52 comprises a battery. In particular, power source 52 is preferably a thin profile battery which includes first and second terminals of opposite polarity. More particularly, the battery has a lid or negative (i.e., ground) terminal or electrode, and a can or positive (i.e., power) terminal or electrode.

Conductive epoxy is applied over desired areas of support surface 20 using conventional printing techniques, such as stencil or screen printing, to assist in component attachment described just below. Alternately, solder or another conductive material is employed instead of conductive epoxy. The power source 52 is provided and mounted on support surface 20 using the conductive epoxy. Integrated circuit 54 and capacitor 55 are also provided and mounted or conductively bonded on the support surface 20 using the conductive epoxy. Integrated circuit 54 can be mounted either before or after the power source 52 is mounted on the support surface 20.

Integrated circuit 54 includes suitable circuitry for providing wireless communications. For example, in one embodiment, integrated circuit 54 includes a processor 62, memory 63, and wireless communication circuitry or transponder circuitry 64 (components 62, 63, 64 are shown in phantom in FIG. 3) for providing wireless communications with interrogator unit 14. An exemplary and preferred integrated circuit 54 is described in U.S. patent application Ser. No. 08/705,043, incorporated by reference above.

One embodiment of transponder circuitry 64 includes a transmitter and a receiver respectively operable to transmit and receive wireless electronic signals. In particular, transponder circuitry 64 is operable to transmit an identification signal responsive to receiving a polling signal from interrogator 14. In the described embodiment, processor 62 is configured to process the received polling signal to detect a predefined code within the polling signal. Responsive to the detection of an appropriate polling signal, processor 62 instructs transponder circuitry 64 to output an identification signal. The identification signal contains an appropriate code to identify the particular device 10 transmitting the identification signal in certain embodiments. The identification and polling signals are respectively transmitted and received via antennas 32, 34 of the device 10.

First and second connection terminals 53, 58 are coupled to the integrated circuit 54 by conductive epoxy in accordance with a preferred embodiment of the invention. The conductive epoxy also electrically connects the first terminal of the power source 52 to the first connection terminal 53. In the illustrated embodiment, power source 52 is placed lid down such that the conductive epoxy makes electrical contact between the negative terminal of the power source 52 and the first connection terminal 53.

Power source 52 has a perimetral edge 56, defining the second power source terminal, which is provided adjacent second connection terminal 58. In the illustrated embodiment, perimetral edge 56 of the power source 52 is cylindrical, and the connection terminal 58 is arcuate and has a radius slightly greater than the radius of the power source 52, so that connection terminal 58 is closely spaced apart from the edge 56 of power source 52.

Subsequently, conductive epoxy is dispensed relative to perimetral edge 56 and electrically connects perimetral edge 56 with connection terminal 58. In the illustrated embodiment, perimetral edge 56 defines the can of the power source 52. The conductive epoxy connects the positive terminal of the power source 52 to connection terminal 58. The conductive epoxy is then cured.

Figure 4:
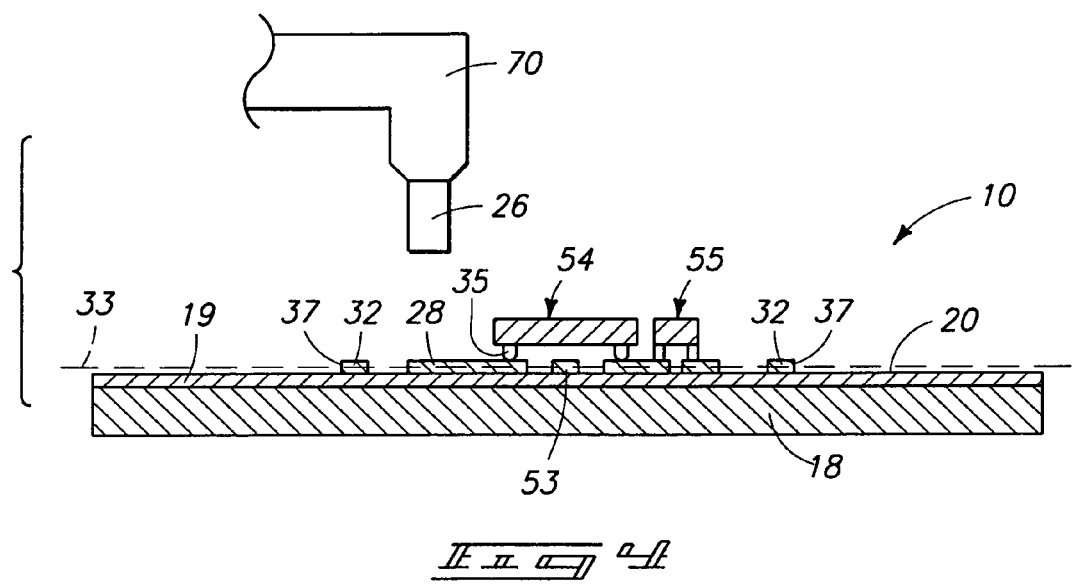
FIG. 4 is cross-sectional view, taken along line 4—4, of the wireless communication device shown in FIG. 3 at an intermediate processing step.
Figure 5:
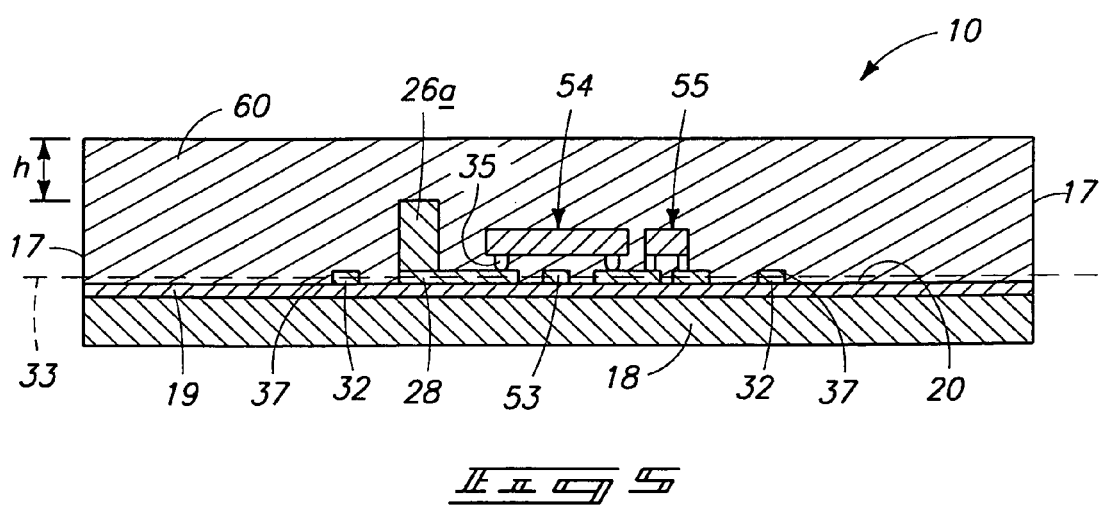
FIG. 5 is a cross-sectional view of the wireless communication device at a processing step subsequent to FIG. 4.
Figure 6:
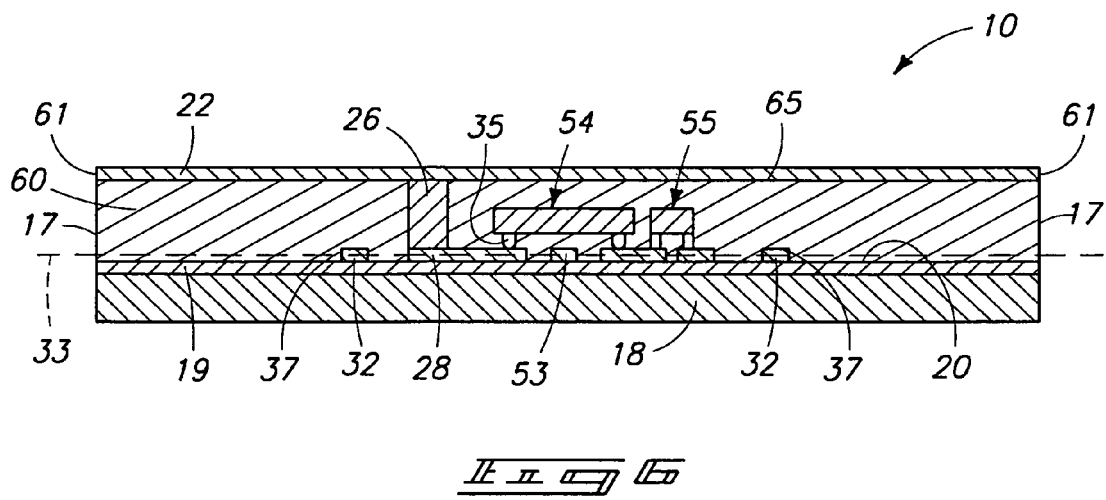
FIG. 6 is a cross-sectional view of the wireless communication device at a processing step subsequent to FIG. 5.

Referring to FIG. 4–FIG. 6, a method of forming an embodiment of wireless communication device 10 is shown. In the illustrated method, an electrical connection, such as a conductive post or pin 26, is conductively bonded to electrical connection 28 using a pick and place surface mount machine 70 (shown in FIG. 4). Preferably, the integrated circuit 54 and the capacitor 55 are also placed using the surface mount machine 70. Conductive pin 26 is utilized to provide electrical conductivity between electrical connection 28, conductive trace 30, and other conductive layers (e.g., a ground plane layer described below) of the wireless communication device 10. Other methods of forming connection 26 may be utilized.

Referring to FIG. 5, an encapsulant, such as encapsulating epoxy material, is subsequently formed following component attachment to provide a first encapsulant layer or insulative layer 60. In one embodiment, insulative layer 60 is provided over the entire support surface 20. Insulative layer 60 encapsulates or envelopes the antennas 32, 34, integrated circuit 54, power source 52, conductive circuitry 30, capacitor 55, and at least a portion of the support surface 20 of substrate 18. Insulative layer 60 defines an intermediate portion of a housing for the wireless communication device 10. Insulative layer 60 operates to insulate the components (i.e., antennas 32, 34, integrated circuit 54, power source 52, conductive circuitry 30 and capacitor 55) from other conductive portions of the wireless communication device 10 formed in subsequent processing steps described below.

An exemplary encapsulant is a flowable encapsulant. The flowable encapsulant is applied over substrate 18 and subsequently cured following the appropriate covering of the desired components. In the illustrated embodiment, such encapsulant constitutes a two-part epoxy including fillers, such as silicon and calcium carbonate. The preferred two-part epoxy is sufficient to provide a desired degree of flexible rigidity. Such encapsulation of wireless communication device 10 is described in U.S. patent application Ser. No. 08/800,037, filed Feb. 13, 1997, assigned to the assignee of the present application, and incorporated herein by reference.

Other encapsulant materials of insulative layer 60 can be used in accordance with the present invention. In addition, the thickness of insulative layer 60 can be varied. Using alternative encapsulant materials and the adjusting of the dimensions of insulative layer 60 alter the dielectric characteristics (i.e., dielectric constant) of layer 60.

Referring to FIG. 6, wireless communication device 10 is illustrated at an intermediate processing step. A portion of insulative layer 60 is preferably removed. The removed portion is represented by the dimension "h" in FIG. 5. Such removal provides a substantially planar dielectric surface 65 of insulative layer 60. Dielectric surface 65 is substantially parallel to the plane 33 defined by antennas 32, 34. The portion is removed by sanding insulative layer 60 to provide planar surface 65 according to one processing method of the present invention. Insulative layer 60 is preferably sanded to a predetermined thickness, such as 90 mils. In other embodiments, the entire insulative layer 60 is utilized and removal of the upper portion of layer 60 is not implemented.

Figure 7:
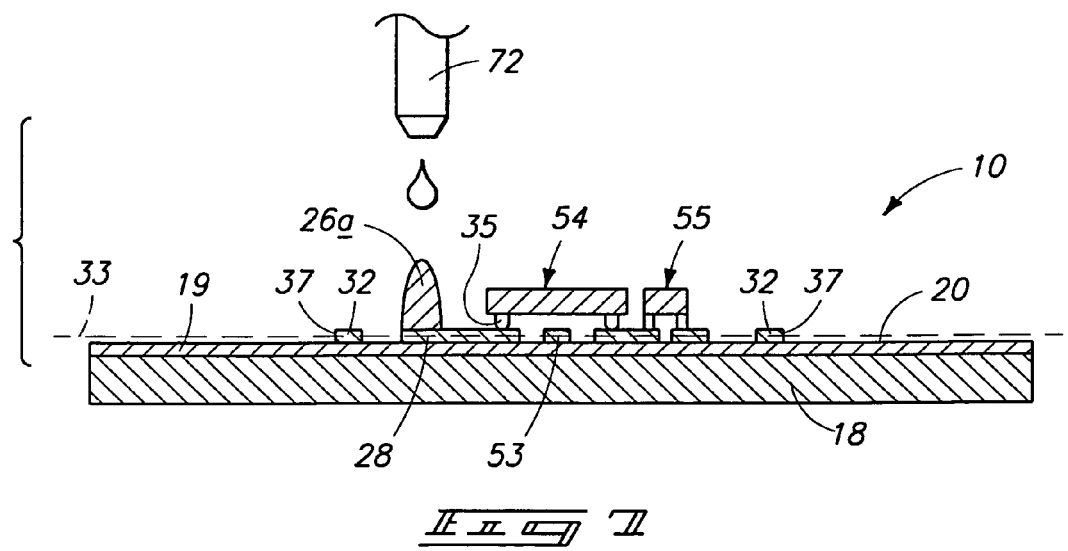
FIG. 7 is a cross-sectional view, similar to FIG. 4, of an alternative intermediate processing step.
Figure 9:
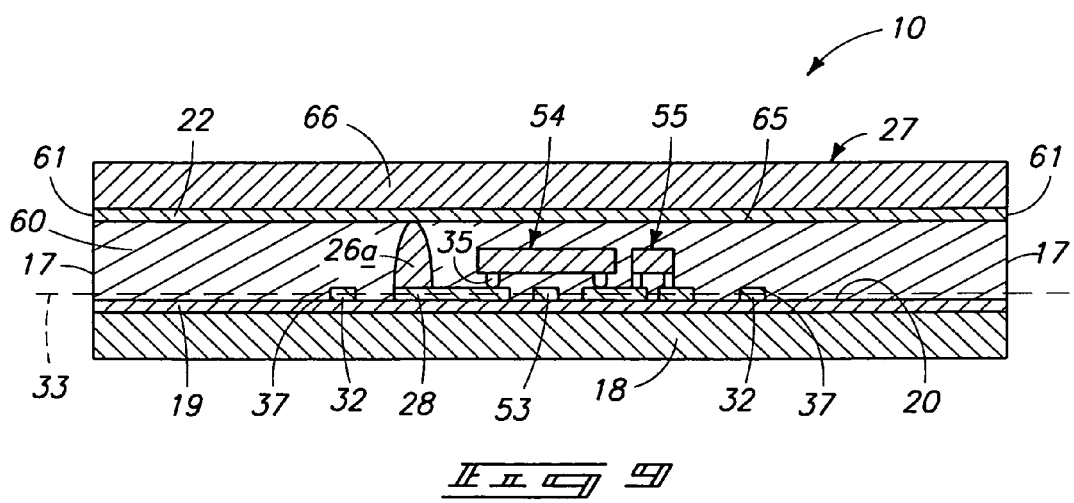
FIG. 9 is a cross-sectional view of another embodiment of the wireless communication device.

In embodiments where one of connections 26, 26a is provided (alternate connection 26a is shown in FIGS. 7 and 9), sanding or partially removing insulative layer 60 exposes a top portion of the connection 26, 26a permitting electrical coupling therewith adjacent dielectric surface 65.

The thickness of insulative layer 60 defines the distance between a conductive layer 22 (described below) and antennas 32, 34, provided adjacent opposing sides of layer 60. The thickness of insulative layer 60 is chosen as a function of the dielectric constant of the encapsulant and the desired frequency for communication.

After provision of insulative layer 60, a conductive layer 22 is formed or applied over the dielectric surface 65 thereof. Conductive layer 22 includes peripheral edges 61. Preferably, conductive layer 22 covers or is provided over the entire insulative dielectric surface 65. Alternatively, conductive layer 22 is patterned to cover predefined portions of dielectric surface 65. In embodiments wherein conductive layer 22 is patterned, the layer 22 is preferably formed at least over antennas 32, 34. More specifically, the respective peripheral edges 37, 38 of antennas 32, 34 are provided within the confines of the peripheral edges 61 of conductive layer 22.

Conductive layer 22 formed upon dielectric surface 65 is preferably substantially planar. In addition, conductive layer 22 is substantially parallel to the plane 33 defined by antennas 32, 34, as well as dielectric surface 65.

In one embodiment, conductive layer 22 comprises a stencil printed polymer thick film (PTF). The polymer thick film is typically 70–73% overfilled. In an alternative embodiment, conductive layer 22 is a conductive epoxy comprising approximately 70% metal. Further alternatively, conductive layer 22 comprises copper or gold foil laminated upon the dielectric surface 65 of insulative layer 60. In still another embodiment of the present invention, metal such as gold is sputtered upon dielectric surface 65 of insulative layer 60 to form conductive layer 22.

Conductive layer 22 can be configured to operate as a ground plane and interact with antennas 32, 34. In particular, conductive layer 22 can be used to form a radio frequency (RF) shield. Inasmuch as the preferred embodiment of communication device 10 communicates via wireless signals, it is desired to reduce or minimize interference, such as incident RF radiation. Conductive layer 22 interacts with antennas 32, 34 to improve the RF operation of wireless communication device 10.

In one embodiment, conductive layer 22 operates to shield some wireless electronic signals from the receive antenna 34 and reflect other wireless electronic signals toward the antenna 34. Conductive layer 22 includes a first side, which faces away from antennas 32, 34 (opposite surface 65) and a second side, which faces antennas 32, 34 (adjacent surface 65). Electronic signals received on the first side of the conductive layer 22 are shielded or blocked by layer 22 from reaching the antennas 32, 34. Electronic signals received on the second side of the conductive layer 22, which pass by or around antennas 32, 34, are reflected by layer 22.

Some of the wireless communication signals transmitted by communications device 10 via antenna 32 are reflected by conductive layer 22. In particular, wireless signals transmitted from antenna 32 which strike the second side of conductive layer 22 are reflected thereby.

Such shielding and reflecting by conductive layer 22 provides a highly directional wireless communication device 10. The provision of conductive layer 22 within wireless communication device 10 results in robust wireless communications with interrogator 14 and provides increased reliability.

The conductive layer 22 is electrically connected with power source 52 in the illustrated embodiments of the present invention. Conductive layer 22 can be electrically coupled with either the positive or negative terminal of power source 52. Coupling of conductive layer 22 with one of the terminals of power source 52 provides layer 22 at the voltage potential of the respective terminal.

In one embodiment, conductive layer 22 is electrically coupled with the ground (i.e., negative) terminal of power source 52 through the integrated circuit 54. Referring specifically to FIG. 6, integrated circuit 54 includes a first pin 35 internally connected with the ground terminal of power source 52 (not shown). First pin 35 is additionally conductively bonded with electrical connection 28 of conductive trace 30. Electrical connection 28 is conductively coupled with connection pin 26. Pin 26 is connected with conductive layer 22 and provides electrical coupling of conductive layer 22 and power source 52 through insulative layer 60.

Coupling of one of the power terminals of power source 52 and ground plane/conductive layer 22 provides layer 22 at a common reference voltage. In particular, electrically connecting ground plane/conductive layer 22 and the ground terminal of power source 52 via electrical connections 26, 28 electrically grounds layer 22. Alternatively, ground plane/conductive layer 22 is coupled with the power electrode of power source 52 via electrical connections 26, 28 in other embodiments of the invention. Coupling ground plane/conductive layer 22 with the power electrode of power source 52 provides layer 22 at the positive potential of power source 52.

Pin 26 is coupled directly with one of the terminals of power source 52 in other embodiments of the invention (not shown), thereby bypassing integrated circuit 54. Alternatively, no electrical connection is made to ground plane/conductive layer 22. In such an embodiment, ground plane/conductive layer 22 is insulated and the voltage of layer 22 is permitted to float.

Referring to FIG. 7, an alternative electrical connection 26a is shown. Electrical connection 26a also provides conductivity through insulative layer 60. Connection 26a electrically couples conductive layer 22 and electrical connection 28. In this embodiment, electrical connection 26a comprises conductive epoxy. A dispenser 72 is utilized to dispense the conductive epoxy onto connection 28 of conductive trace 30 in the depicted embodiment.

Connections 26, 26a may be formed at positions other than those illustrated in the depicted embodiments of device 10. In particular, connections 26, 26a may be provided at any appropriate location to provide electrical coupling of a terminal of power source 52 and conductive layer 22.

Figure 8:
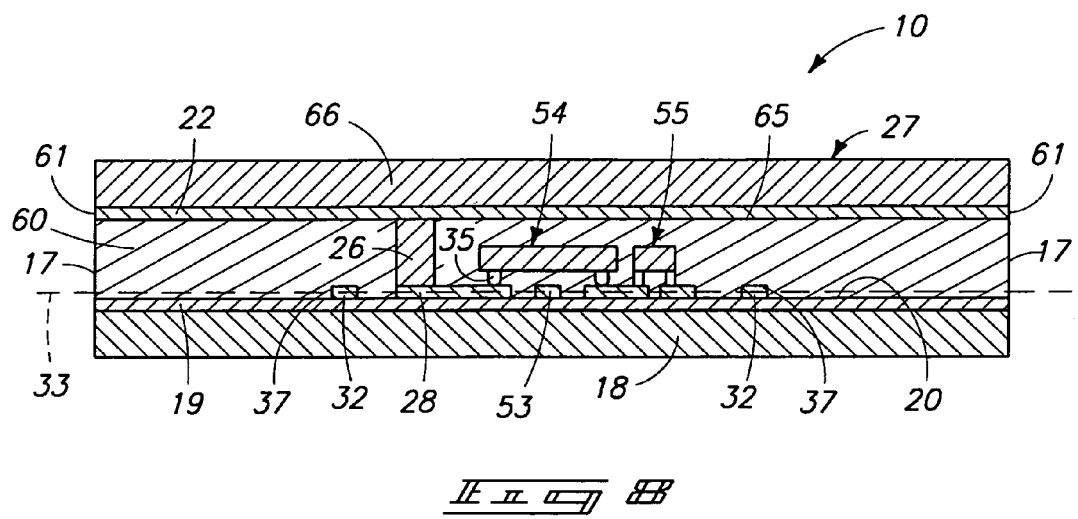
FIG. 8 is a cross-sectional view of a first embodiment of the wireless communication device.

Referring to FIG. 8 and FIG. 9, completed wireless communication devices 10 are shown. Following the provision of conductive layer 22 and one, if any, of electrical connections 26, 26a, an upper housing portion 66 is preferably formed over the conductive layer 22 of the respective illustrated devices 10. In one embodiment, upper housing portion 66 comprises a second encapsulant layer which covers and/or encapsulates the conductive layer 22 of the respective devices 10. In the depicted embodiment, first and second encapsulant layers 60, 66 envelope the entire conductive layer 22. Such is desired to insulate the conductive layer 22.

Second encapsulant layer 66 may comprise the two-part encapsulant utilized to form insulative first encapsulant layer 60. Following the provision of second encapsulant layer 66 upon conductive layer 22, the encapsulant is subsequently cured forming a substantially void-free housing 27 or solid mass with substrate 18 and first encapsulant layer 60. In one embodiment, housing 27 of wireless communication device 10 has a width of about 3.375 inches, a height of about 2.125 inches, and a thickness less than or equal to about 0.0625 inches.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A radio frequency identification device comprising:
a substrate having a support surface;
wireless communication circuitry upon the support surface of the substrate;
at least one antenna electrically coupled with the wireless communication circuitry;
a conductive layer configured to interact with the at least one antenna;

an insulative layer intermediate the conductive layer and the at least one antenna; and wherein the at least one antenna and conductive layer include respective peripheral edges and the peripheral edges of the at least one antenna are provided within the confines of the peripheral edges of the conductive layer.

2. The device according to claim 1 wherein the wireless communication circuitry is intermediate the at least one antenna and the conductive layer.

3. The device according to claim 1 further comprising a housing configured to encapsulate the wireless communication circuitry.

4. The device according to claim 3 wherein the housing includes the substrate.

5. The device according to claim 1 wherein the insulative layer is over substantially the entire support surface and the conductive layer is over substantially the entire insulative layer.

6. The device according to claim 1 further comprising a power source having plural terminals coupled with the wireless communication circuitry.

7. The device according to claim 6 further comprising an electrical connection provided through the insulative layer and operable to conductively couple the conductive layer and one of the terminals of the power source.

8. The device according to claim 1 wherein the insulative layer forms a first encapsulant layer operable to envelope the wireless communication circuitry, the at least one antenna and the support surface.

9. The device according to claim 8 further comprising a second encapsulant layer over the conductive layer.

10. The device according to claim 9 wherein the first and second encapsulant layers and the substrate form a substantially solid housing.

11. The device according to claim 1 wherein the wireless communication circuitry comprises transponder circuitry configured to transmit an identification signal responsive to receiving a polling signal.

12. The device according to claim 1 further comprising a processor operable to process signals received via the at least one antenna.

13. The device according to claim 1 wherein the at least one antenna defines a plane, the conductive layer is substantially planar, and the conductive layer is substantially parallel to the plane defined by the at least one antenna.

14. The device according to claim 1 wherein the at least one antenna is operable to receive wireless communication signals and the conductive layer is configured to shield some of the wireless communication signals from the at least one antenna and reflect others of the wireless communication signals toward the at least one antenna.

15. The device according to claim 1 wherein the conductive layer comprises a ground plane configured to electromagnetically interact with the at least one antenna.

16. A remote intelligent communication device comprising:

a substrate having a support surface;
a conductive trace formed upon the support surface and including at least one antenna configured to at least one of transmit and receive wireless communication signals;
transponder circuitry bonded to the support surface and electrically coupled with the conductive trace;
a first encapsulant layer encapsulating the transponder circuitry and the at least one antenna with at least a portion of the substrate;
a conductive layer positioned upon the first encapsulant layer to interact with the at least one antenna; and
a second encapsulant layer over the conductive layer and forming a substantially solid housing with the substrate and the first encapsulant layer.

17. The remote intelligent communication device according to claim 16 further comprising a power source coupled with the transponder circuitry.

18. The remote intelligent communication device according to claim 16 further comprising an electrical connection through the first encapsulant layer coupling the conductive layer and the conductive trace.

19. The remote intelligent communication device according to claim 16 further comprising a processor operable to process at least some of the wireless communication signals.

20. The remote intelligent communication device according to claim 16 wherein the transponder circuitry is configured to transmit an identification signal responsive to receiving a polling signal.

21. The remote intelligent communication device according to claim 16 wherein the conductive layer is configured to shield some of the wireless communication signals from the at least one antenna and reflect others of the wireless communication signals toward the at least one antenna.

22. The remote intelligent communication device according to claim 21 further comprising an electrical connection conductively coupling the conductive layer with at least one terminal of the power source.

23. The remote intelligent communication device according to claim 16 wherein the transponder circuitry is intermediate the at least one antenna and the conductive layer.

24. The remote intelligent communication device according to claim 16 wherein the first encapsulant layer contacts the transponder circuitry and the at least one antenna.

25. A radio frequency identification device configured to receive wireless communication signals comprising:

a lower housing;
at least one antenna upon the lower housing;
transponder circuitry provided upon the lower housing and coupled with the at least one antenna;
a power source having plural terminals electrically and conductively bonded with the transponder circuitry;
an insulative layer over the at least one antenna; and
a conductive layer over the at least one antenna.

26. The radio frequency identification device according to claim 25 further comprising an electrical connection conductively coupling the conductive layer with at least one terminal of the power source.

27. The radio frequency identification device according to claim 25 further comprising an upper housing portion over the conductive layer.

28. The radio frequency identification device according to claim 27 wherein the lower housing, the insulative layer, and the upper housing provide a substantially solid housing.

29. The radio frequency identification device according to claim 25 further comprising a processor coupled with the transponder circuitry and operable to process at least some of the wireless communication signals.

30. The radio frequency identification device according to claim 25 wherein the transponder circuitry is configured to transmit an identification signal responsive to receiving a polling signal.

31. The radio frequency identification device according to claim 25 wherein the conductive layer is positioned to shield some of the wireless communication signals from the at least one antenna and reflect others of the wireless communication signals toward the at least one antenna.

32. The radio frequency identification device according to claim 25 wherein the transponder circuitry is intermediate the at least one antenna and the conductive layer.

33. A method of operating a wireless communication device comprising:
coupling an antenna with wireless communication circuitry intermediate the antenna and a conductive layer;
receiving wireless communication signals using the wireless communication circuitry;
transmitting wireless communication signals using the wireless communication circuitry; and
interacting the conductive layer with the antenna.

34. The method of operating a wireless communication device according to claim 33 further comprising processing some of the wireless communication signals.

35. The method of operating a wireless communication device according to claim 33 wherein the interacting comprises:
shielding some of the wireless communication signals from the antenna; and
reflecting others of the wireless communication signals toward the substrate and the antenna thereover.

36. The method of operating a wireless communication device according to claim 33 wherein the transmitting comprises transmitting an identification signal responsive to receiving a polling signal.

37. The method of operating a wireless communication device according to claim 33 further comprising:
supplying operational power to the wireless communication circuitry using a power source; and
electrically grounding the conductive layer using the power source.

38. A method of operating a radio frequency identification device comprising:
providing an antenna upon a substrate;
coupling transponder circuitry with the antenna;
using the antenna and transponder circuitry, at least one of transmitting and receiving wireless communication signals;
providing a ground plane with the transponder circuitry intermediate the antenna and the ground plane; and
interacting the ground plane with the antenna comprising:
shielding some of the wireless communication signals from the antenna; and
reflecting others of the wireless communication signals toward the substrate and the antenna thereover.

39. The method of operating a radio frequency identification device according to claim 38 further comprising:
supplying operational power to the wireless communication circuitry using a power source; and
electrically grounding the conductive layer using the power source.

40. The method of operating a radio frequency identification device according to claim 38 further comprising processing at least some of the wireless communication signals.

41. A method of forming a wireless communication device comprising:
providing a substrate having a support surface;
forming an antenna upon the support surface;
conductively coupling wireless communication circuitry with the antenna;
forming an insulative layer over at least a portion of the antenna; and
providing a conductive layer over at least a portion of the insulative layer.

42. The method of forming a wireless communication device according to claim 41 further comprising electrically grounding the conductive layer.

43. The method of forming a wireless communication device according to claim 41 further comprising providing electrical conductivity through the insulative layer.

44. The method of forming a wireless communication device according to claim 41 further comprising:
providing a power source; and
coupling the conductive layer with a terminal of the power source.

45. The method of forming a wireless communication device according to claim 44 wherein the coupling comprises providing a conductive post.

46. The method of forming a wireless communication device according to claim 44 wherein the coupling comprises dispensing conductive material.

47. The method of forming a wireless communication device according to claim 41 wherein the providing the conductive layer comprises providing the conductive layer over substantially the entire support surface.

48. The method of forming a wireless communication device according to claim 41 wherein the providing of the conductive layer includes positioning the conductive layer to interact with the antenna.

49. The method of forming a wireless communication device according to claim 41 further comprising removing a portion of the insulative layer providing a substantially planar insulative layer having a predetermined thickness.

50. The method of forming a wireless communication device according to claim 41 wherein the forming of the insulative layer comprises encapsulating the antenna, the wireless communication circuitry and at least a portion of the support surface.

51. The method of forming a wireless communication device according to claim 41 further comprising encapsulating at least a portion of the conductive layer with an encapsulant.

52. The method of forming a wireless communication device according to claim 51 wherein the encapsulant, the substrate, and insulative layer form a substantially solid device.

53. The method of forming a wireless communication device according to claim 41 wherein the wireless communication device comprises a remote intelligent communication device.

54. The method of forming a wireless communication device according to claim 41 wherein the wireless communication device comprises a radio frequency identification device.

55. A method of forming a radio frequency identification device comprising:
providing a substrate having a support surface;
printing an antenna over the support surface configured to at least one of transmit and receive wireless communication signals;
conductively bonding transponder circuitry with the antenna;
first encapsulating the antenna and the transponder circuitry forming a first encapsulant layer;
providing a conductive layer upon at least a portion of the encapsulant layer; and
second encapsulating the conductive layer forming a second encapsulant layer.

56. The method of forming a radio frequency identification device according to claim 55 further comprising removing some of the first encapsulant layer providing a substantially planar first encapsulant layer having a predetermined thickness.

57. The method of forming a radio frequency identification device according to claim 55 further comprising providing the conductive layer over the antenna.

58. The method of forming a radio frequency identification device according to claim 55 further comprising coupling a processor with the transponder circuitry.

59. The method of forming a radio frequency identification device according to claim 55 further comprising electrically grounding the conductive layer.

60. The method of forming a radio frequency identification device according to claim 55 further comprising conductively bonding a power source with the transponder circuitry.

61. The method of forming a radio frequency identification device according to claim 55 wherein the first encapsulant layer, the second encapsulant layer, and the substrate form a substantially solid device.

62. A method of forming a radio frequency identification device comprising:
providing a substrate having a support surface;
printing a conductive trace comprising a plurality of terminal connections and first and second antennas upon the support surface, the first antenna being configured to transmit wireless signals and the second antenna being configured to receive wireless signals;
conductively bonding a battery with the terminal connections;
conductively bonding transponder circuitry with the terminal connections and the first and second antennas;
coupling a processor with the transponder circuitry;
providing an electrical connection comprising one of dispensing conductive material and providing a conductive post;
first encapsulating the first and second antennas, the battery, the transponder circuitry, the processor, the electrical connection, and at least a portion of the support surface, the first encapsulating forming a first encapsulant layer;
removing some of the first encapsulant layer providing a substantially planar first encapsulant layer having a predetermined thickness;
providing a ground plane upon the first encapsulant layer and over substantially the entire support surface, the providing of the ground plane including positioning the ground plane to interact with the antennas;
electrically coupling the ground plane with one of the terminal connections using the electrical connection; and
second encapsulating the ground plane forming a second encapsulant layer and a substantially solid device with the substrate and the first encapsulant layer.

63. A wireless communication device comprising:
a housing;
an antenna coupled with the housing and configured to at least one of output wireless signals and receive wireless signals;
wireless communication circuitry coupled with the housing and the antenna; and
a ground plane coupled with the housing and configured to enhance wireless communications via the antenna, the wireless communication circuitry being positioned intermediate the ground plane and the antenna.

64. The device according to claim 63 wherein the wireless communication circuitry comprises radio frequency identification device circuitry.

65. The device according to claim 63 wherein the antenna, the ground plane, the wireless communication circuitry, and the housing provide a substantially void-free wireless communication device.

66. The device according to claim 63 wherein the housing comprises a substrate and at least one encapsulant layer.

67. The device according to claim 66 wherein the at least one encapsulant layer contacts at least respective portions of the antenna, the wireless communication circuitry and the ground plane.

68. The device according to claim 63 wherein the housing comprises an encapsulant layer intermediate the ground plane and a substrate.

69. A wireless communication device comprising:
a substrate having a support surface;
an antenna elevationally over the support surface and configured to at least one of output wireless signals and receive wireless signals;
wireless communication circuitry elevationally over the antenna and coupled with the antenna; and
a ground plane elevationally over the wireless communication circuitry and configured to interact with the antenna.

70. The device according to claim 69 wherein the wireless communication circuitry comprises radio frequency identification device circuitry.

71. The device according to claim 69 further comprising at least one encapsulant layer.

72. The device according to claim 71 wherein the antenna, the ground plane, the wireless communication circuitry, and the at least one encapsulant layer provide a substantially void-free wireless communication device.

73. The device according to claim 71 wherein the at least one encapsulant layer contacts at least respective portions of the antenna, the wireless communication circuitry and the ground plane.

74. A wireless communication device comprising:
an antenna configured to at least one of output wireless signals and receive wireless signals;
a ground plane configured to enhance wireless communications via the antenna;
wireless communication circuitry coupled with the antenna;
a housing configured to encapsulate and contact at least respective portions of the antenna, the wireless communication circuitry and the ground plane; and
wherein the antenna, the ground plane, the wireless communication circuitry, and the housing provide a substantially void-free wireless communication device.

75. The device according to claim 74 wherein the wireless communication circuitry comprises radio frequency identification device circuitry.

76. The device according to claim 74 wherein the housing comprises a substrate and at least one encapsulant layer.

77. The device according to claim 74 wherein the housing comprises an encapsulant layer intermediate the ground plane and a substrate.

78. The device according to claim 74 wherein the wireless communication circuitry is positioned intermediate the antenna and the ground plane.

79. A method of forming a wireless communication device comprising:
providing an antenna configured to at least one of output wireless signals and receive wireless signals;

positioning a ground plane to enhance wireless communications via the antenna;
providing wireless communication circuitry intermediate the antenna and the ground plane; and
coupling the wireless communication circuitry with the antenna.

80. The method according to claim 79 wherein the providing the wireless communication circuitry comprises providing radio frequency identification device circuitry.

81. The method according to claim 79 further comprising encapsulating the antenna, the ground plane and the wireless communication circuitry.

82. The method according to claim 81 wherein the encapsulating comprises providing a substantially void-free wireless communication device.

83. The method according to claim 81 wherein the encapsulating comprises contacting at least respective portions of the antenna, the wireless communication circuitry and the ground plane with at least one encapsulant layer.

84. A method of forming a wireless communication device comprising:
providing a substrate having a support surface;
providing an antenna configured to at least one of output wireless signals and receive wireless signals elevationally over the support surface;
positioning wireless communication circuitry elevationally over the antenna;
coupling the wireless communication circuitry with the antenna; and
positioning a ground plane elevationally over the wireless communication circuitry to enhance wireless communications via the antenna.

85. The method according to claim 84 wherein the providing the wireless communication circuitry comprises providing radio frequency identification device circuitry.

86. The method according to claim 84 further comprising encapsulating the antenna, the ground plane and the wireless communication circuitry.

87. The method according to claim 86 wherein the encapsulating comprises providing a substantially void-free wireless communication device.

88. The method according to claim 86 wherein the encapsulating comprises contacting at least respective portions of the antenna, the wireless communication circuitry and the ground plane with at least one encapsulant layer.

89. A method of forming a wireless communication device comprising:
providing an antenna configured to at least one of output wireless signals and receive wireless signals;
coupling wireless communication circuitry with the antenna;
providing a ground plane to enhance wireless communications via the antenna;
providing a housing encapsulating and contacting at least respective portions of the antenna, the wireless communication circuitry and the ground plane; and
wherein the providing the ground plane provides the wireless communication circuitry intermediate the antenna and the ground plane.

90. The method according to claim 89 wherein the coupling wireless communication circuitry comprises coupling radio frequency identification device circuitry.

91. The method according to claim 89 wherein the providing the housing comprises providing a substantially void-free wireless communication device.

92. A radio frequency identification device comprising:
a substrate having a support surface;
wireless communication circuitry upon the support surface of the substrate;
at least one antenna electrically coupled with the wireless communication circuitry;
a conductive layer configured to interact with the at least one antenna;
an insulative layer intermediate the conductive layer and the at least one antenna; and
wherein the wireless communication circuitry is intermediate the at least one antenna and the conductive layer.

93. A radio frequency identification device comprising:
a substrate having a support surface;
wireless communication circuitry upon the support surface of the substrate;
at least one antenna electrically coupled with the wireless communication circuitry;
a conductive layer configured to interact with the at least one antenna;
an insulative layer intermediate the conductive layer and the at least one antenna; and
wherein the insulative layer is over substantially the entire support surface and the conductive layer is over substantially the entire insulative layer.

94. A radio frequency identification device comprising:
a substrate having a support surface;
wireless communication circuitry upon the support surface of the substrate;
at least one antenna electrically coupled with the wireless communication circuitry;
a conductive layer configured to interact with the at least one antenna;
an insulative layer intermediate the conductive layer and the at least one antenna;
a power source having plural terminals coupled with the wireless communication circuitry; and
an electrical connection provided through the insulative layer and operable to conductively couple the conductive layer and one of the terminals of the power source.

95. A wireless communication device comprising:
an antenna configured to at least one of output wireless signals and receive wireless signals;
a ground plane configured to enhance wireless communications via the antenna;
wireless communication circuitry coupled with the antenna;
a housing configured to encapsulate and contact at least respective portions of the antenna, the wireless communication circuitry and the ground plane; and
wherein the housing comprises an encapsulant layer intermediate the ground plane and a substrate.

96. A wireless communication device comprising:
an antenna configured to at least one of output wireless signals and receive wireless signals;
a ground plane configured to enhance wireless communications via the antenna;
wireless communication circuitry coupled with the antenna;
a housing configured to encapsulate and contact at least respective portions of the antenna, the wireless communication circuitry and the ground plane; and
wherein the wireless communication circuitry is positioned intermediate the antenna and the ground plane.

97. A method of forming a wireless communication device comprising:
- providing an antenna configured to at least one of output wireless signals and receive wireless signals;
- coupling wireless communication circuitry with the antenna;
- providing a ground plane to enhance wireless communications via the antenna;
- providing a housing encapsulating and contacting at least respective portions of the antenna, the wireless communication circuitry and the ground plane; and
- wherein the providing the housing comprises providing a substantially void-free wireless communication device.

* * * * *